(12) United States Patent
Ikeda

(10) Patent No.: US 12,308,066 B2
(45) Date of Patent: May 20, 2025

(54) PSEUDO-STATIC RANDOM ACCESS MEMORY

(71) Applicant: Winbond Electronics Corp., Taichung (TW)

(72) Inventor: Hitoshi Ikeda, Yokohama (JP)

(73) Assignee: Winbond Electronics Corp., Taichung (TW)

( * ) Notice: Subject to any disclaimer, the term of this patent is extended or adjusted under 35 U.S.C. 154(b) by 185 days.

(21) Appl. No.: 18/179,205

(22) Filed: Mar. 6, 2023

(65) Prior Publication Data

US 2024/0055037 A1 Feb. 15, 2024

(30) Foreign Application Priority Data

Aug. 9, 2022 (JP) ................................. 2022-126808

(51) Int. Cl.
   *G11C 7/00* (2006.01)
   *G11C 11/406* (2006.01)
   *G11C 11/4076* (2006.01)

(52) U.S. Cl.
   CPC ... *G11C 11/40611* (2013.01); *G11C 11/40622* (2013.01); *G11C 11/4076* (2013.01)

(58) Field of Classification Search
   CPC ......... G11C 11/40611; G11C 11/40622; G11C 11/4076
   USPC ....................................................... 365/222
   See application file for complete search history.

(56) References Cited

U.S. PATENT DOCUMENTS

| 6,298,000 | B1 * | 10/2001 | Kitade | G11C 11/406 365/222 |
| 6,449,204 | B1 * | 9/2002 | Arimoto | G11C 29/028 365/194 |
| 6,667,933 | B2 * | 12/2003 | Tomita | G11C 8/12 365/233.17 |
| 7,072,243 | B2 * | 7/2006 | Nakamura | G11C 11/4076 365/233.5 |
| 7,203,114 | B2 * | 4/2007 | Okuyama | G11C 11/40603 365/222 |
| 7,336,555 | B2 | 2/2008 | Lee | |
| 7,345,940 | B2 | 3/2008 | Oh | |
| 7,969,807 | B2 * | 6/2011 | Hokenmaier | G11C 11/406 365/230.06 |
| 8,244,972 | B2 * | 8/2012 | Bronson | G06F 12/0897 711/119 |

(Continued)

FOREIGN PATENT DOCUMENTS

| JP | 4-143993 A | 5/1992 |
| JP | 11-167519 A | 6/1999 |
| JP | 2020-194613 A | 12/2020 |

OTHER PUBLICATIONS

Japanese Office Action for Japanese Application No. 2022-126808, dated Jul. 25, 2023, with an English translation.

(Continued)

*Primary Examiner* — Viet Q Nguyen
(74) *Attorney, Agent, or Firm* — Birch, Stewart, Kolasch & Birch, LLP

(57) ABSTRACT

A pseudo-static random access memory includes a control unit, which controls the refresh operations of the memory to be performed as many times as the number of refresh requests that are generated during a period after the first transaction ended and before a second transaction which is after the first transaction.

10 Claims, 5 Drawing Sheets

(56) References Cited

U.S. PATENT DOCUMENTS

| | | | | |
|---|---|---|---|---|
| 8,717,841 | B2* | 5/2014 | Chen | G11C 11/40615 |
| | | | | 365/194 |
| 8,995,216 | B2* | 3/2015 | Furutani | G11C 11/40615 |
| | | | | 365/228 |
| 9,147,460 | B2* | 9/2015 | Matsumoto | G11C 11/40607 |
| 9,189,415 | B2* | 11/2015 | Fee | G06F 13/14 |
| 10,395,720 | B2 | 8/2019 | Nakaoka | |
| 10,410,711 | B2* | 9/2019 | Yoshino | G06F 3/0659 |
| 2003/0202413 | A1* | 10/2003 | Komura | G11C 29/783 |
| | | | | 365/222 |
| 2004/0008544 | A1* | 1/2004 | Shinozaki | G11C 11/40622 |
| | | | | 365/230.06 |
| 2005/0002254 | A1* | 1/2005 | Otsuka | G11C 11/4074 |
| | | | | 365/222 |
| 2006/0059320 | A1* | 3/2006 | Akizuki | G06F 13/161 |
| | | | | 711/158 |
| 2020/0020384 | A1 | 1/2020 | Zhao et al. | |
| 2020/0381041 | A1 | 12/2020 | Nakaoka | |
| 2022/0122652 | A1 | 4/2022 | Brandl et al. | |

OTHER PUBLICATIONS

Korean Office Action for Korean Application No. 10-2022-0115941, dated May 29, 2024, with an English translation.

* cited by examiner

PSEUDO-STATIC RANDOM ACCESS MEMORY

CROSS REFERENCE TO RELATED APPLICATIONS

This application claims priority of Japanese Patent Application No. 2022-126808, filed on Aug. 9, 2022, the entirety of which is incorporated by reference herein.

BACKGROUND OF THE INVENTION

Field of the Invention

The present invention relates to pseudo-static random access memory (pSRAM).

Description of the Related Art

A pSRAM is a semiconductor memory device having an interface compatible with Static Random Access Memory (SRAM).

An example of refresh operation in a conventional pSRAM will be described with reference to FIG. 1. In the example shown in FIG. 1, a read or write transaction is started when the chip select signal CS # converts from high level to low level. Next, when the access signal RD/WR for accessing data in the memory cell array converts from low level to high level, data reading or writing access to the memory cell array is performed. After that, when the chip select signal CS # converts from low level to high level, the read or write transaction is completed. Then, when the access signal RD/WR converts from high level to low level, data reading or writing access to the memory cell array is completed.

Inside the pSRAM, a refresh request signal Ref_request for requesting a refresh operation is generated at predetermined intervals tREFI. Here, when the refresh request signal Ref_request is generated (becomes high level) during the chip select signal CS # being high level, the pSRAM is configured to perform the refresh operation since the refresh signal REF for performing the refresh operation is set to high level immediately. On the other hand, when the refresh request signal Ref_request is generated (becomes high level) during the chip select signal CS # being low level (during read or write access), since the pSRAM is performing read or write access, the execution of the refresh operation is awaited. Then, when the chip select signal CS # is set to high level and the access signal RD/WR converts from high level to low level, the pSRAM performs a refresh operation.

As described above, in a pSRAM, during the period tCSL that the chip select signal CS # is set to low level is longer than the generation interval tREFI of the refresh request signal Ref_request (that is, tCSL>tREFI), since the refresh request is ignored, the refresh operation may not be performed. For example, in the example shown in FIG. 1, two refresh request signals Ref_request are generated during the period tCSL where the chip select signal CS # is set to low level, however, during the period where the chip select signal CS # is set to high level, only one refresh operation will be performed, and the second refresh request is ignored. This can make it difficult to retain data, as refresh operations are not performed in response to each of the refresh requests generated in the transaction.

On the other hand, when tCSL<tREFI, it is possible to prevent the refresh request from being ignored. However, in this case, since the period tCSL where the chip select signal CS # is set to a low level is shortened, the amount of data that can be transmitted and received in one transaction is reduced. Therefore, the data transfer rate may be reduced.

BRIEF SUMMARY OF THE INVENTION

In order to solve the above problems, the present invention provides a pseudo-static random access memory comprising a control unit, a memory refresh request is generated during a first transaction, controlling refresh operations of the memory being to be performed as many times as the number of refresh requests which is generated in the first transaction during a period after the first transaction ends and before a second transaction which is after the first transaction.

According to the present invention, during the period after the first transaction ended and before the second transaction, refresh operations are performed for each refresh requests generated during the first transaction. As a result, even when the period where chip select signal being set to a low level is longer than the generation interval of the refresh request signal, refresh operations can be performed exactly in response to each of the refresh requests generated during the first transaction. Therefore, data retention characteristics can be maintained, and the data transfer rate can be maintained.

DETAILED DESCRIPTION OF THE INVENTION

Figure 2:
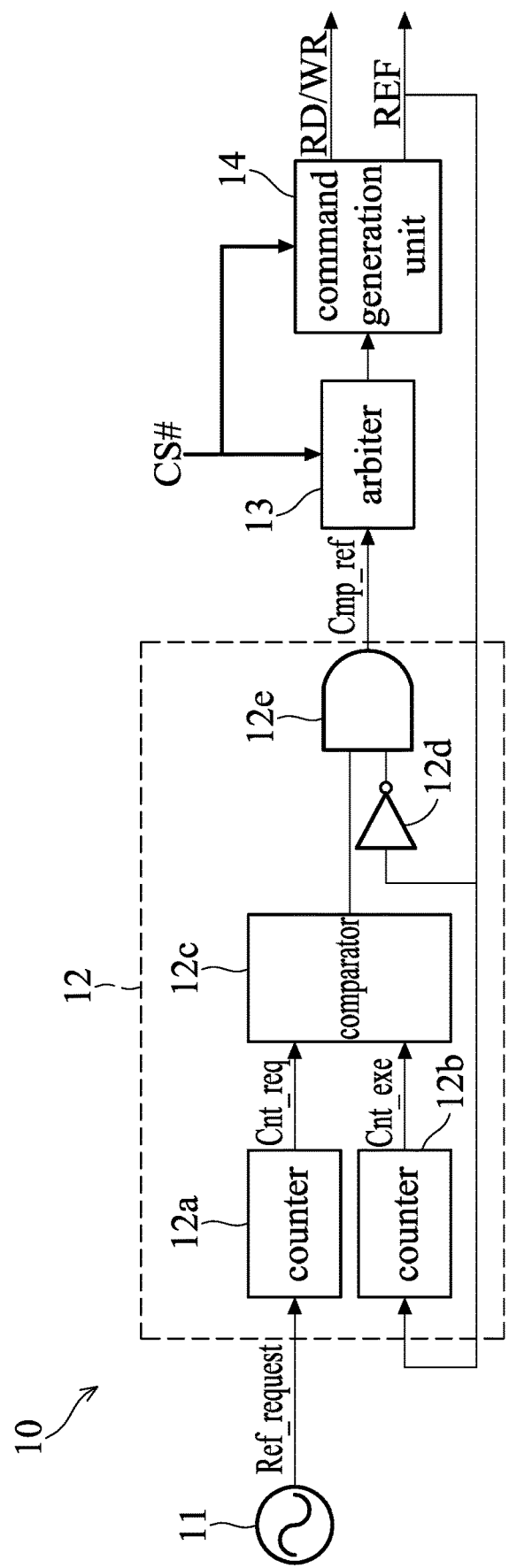
FIG. 2 is a block diagram showing a configuration example of the pSRAM in the first embodiment of the present invention.

FIG. 2 is a block diagram showing a configuration example of a pSRAM (pseudo-static random access memory) 10 according to the first embodiment of the present invention. pSRAM10 is configured to perform memory refresh operations as many times as the number of refresh request signals Ref_request generated during the first transaction when the memory refresh request signal Ref_request is generated during the first transaction, wherein the memory refresh operation is performed during a period after the first transaction ended and before a second transaction which is after the first transaction.

Besides, the pSRAM according to this embodiment may be a clock-synchronous pseudo-static random access memory in which a signal is input or output in synchronization with a clock signal. Furthermore, the pSRAM according to the present embodiment may be an address-data multiplex interface type pSRAM having terminals configured to receive address signals and data signals respectively.

Referring to FIG. 2, pSRAM 10 includes an oscillator 11, a controller 12, an arbiter 13 and a command generation unit 14.

Figure 1:
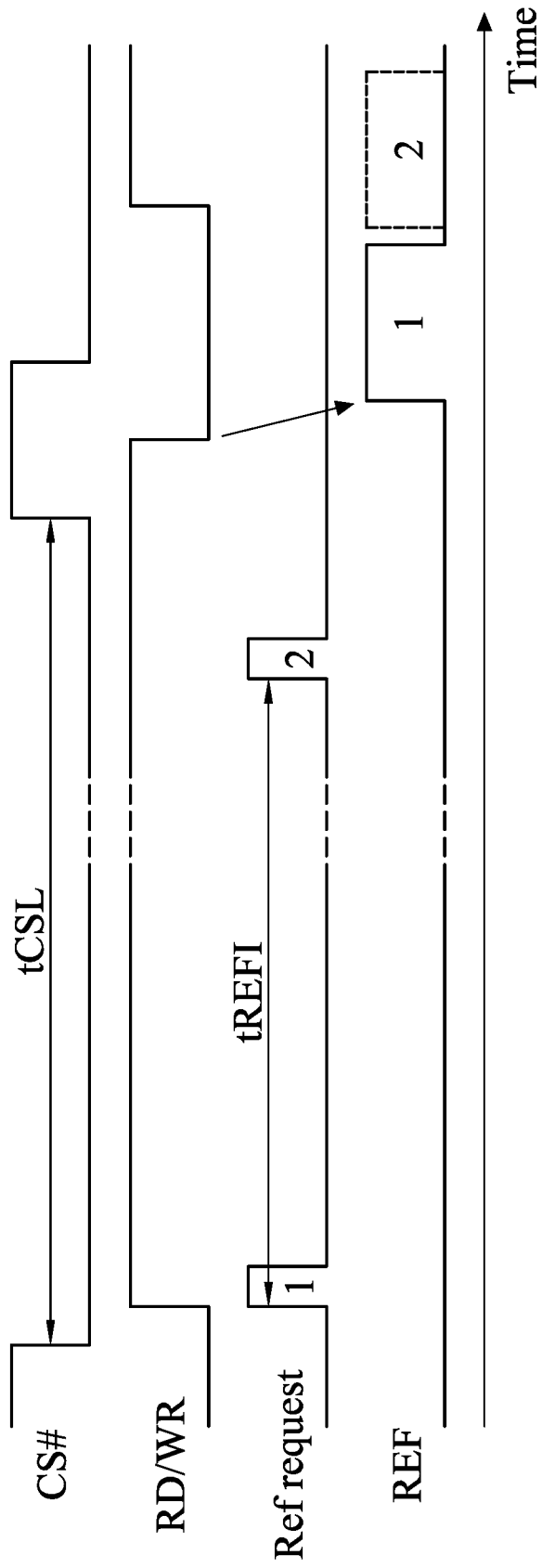
FIG. 1 is a waveform chart showing a signal in a conventional pSRAM.

The oscillator 11 generates a refresh request signal Ref_request in every predetermined intervals (for example, the generation interval tREFI shown in FIG. 1) and outputs it to the control unit 12.

The control unit 12 includes a counter 12a, a counter 12b, a comparator 12c, an inverter 12d, and an AND gate 12e.

The counter 12a is configured to count the number of refresh request signals Ref_request. Specifically, the counter 12a counts the number of input refresh request signals Ref_request each time the refresh request signal Ref_request is input from the oscillator 11. The counter 12a then outputs a signal Cnt_req indicating the number of refresh request signals Ref_request to the comparator 12c.

Note that the value of the signal Cnt_req can be reset to an initial value (for example, 0) each time a transaction starts (the chip select signal CS # converts from high level to low level).

The counter 12b is configured to count the number of refresh operations performed during a period after the first transaction ended and before the second transaction. Specifically, the counter 12b counts the number of input refresh signals REF each time a refresh signal REF for executing a refresh operation is input from the command generation unit 14. The counter 12b then outputs a signal Cnt_exe indicating the number of refresh signals REF to the comparator 12c.

Besides, the value of the signal Cnt_exe can be reset to an initial value (for example, 0) each time a transaction ends (the chip select signal CS # converts from low level to high level).

The comparator 12c is configured to compare the number of refresh request signals Ref_request counted by the counter 12a and the number of refresh signals REF counted by the counter 12b. Specifically, the comparator 12c compares the value of the signal Cnt_req input from the counter 12a and the value of the signal Cnt_exe input from the counter 12b. When Cnt_req>Cnt_exe, the comparator 12c outputs a high-level output signal to the AND gate 12e. On the other hand, the comparator 12c outputs a low-level output signal to the AND gate 12e when Cnt_req≤Cnt_exe.

The inverter 12d logically inverts the refresh signal REF input from the command generation unit 14 and outputs the logically inverted signal to the AND gate 12e.

An output signal output from the comparator 12c is input to one input terminal of the AND gate 12e. A signal output from the inverter 12d is input to the other input terminal of the AND gate 12e. The AND gate 12e performs an AND operation based on the input signal, and outputs a signal Cmp_ref indicating the operation result to the arbiter 13. The signal Cmp_ref is an example of the "refresh control signal" of the present invention.

The arbiter 13 arbitrates between the chip select signal CS # and the signal Cmp_ref and adjusts the timing of outputting the signal Cmp_ref to the command generation unit 14. Furthermore, in the present embodiment, the arbiter 13 is configured to output the refresh control signal (signal Cmp_ref) to the command generation unit 14 every time when the refresh control signal (signal Cmp_ref) is input from the control unit 12 during a period after the first transaction ended and before the second transaction.

Specifically, when the chip select signal CS # is at high level (i.e., during a period after the first transaction ended and before the second transaction), the arbiter 13 outputs the high-level signal Cmp_ref to the command generation unit 14 when the high-level signal Cmp_ref is input from the control unit 12. Also, during a period that the chip select signal CS # is at low level (i.e., in a transaction), when the high-level signal Cmp_ref is input from the control unit 12, the arbiter 13 does not output the high-level signal Cmp_ref to the command generation unit 14.

The command generation unit 14 generates a refresh signal REF for executing a refresh operation under the control of the controller 12. Also, the command generation unit 14 outputs the refresh signal REF to the counter 12b each time it generates the refresh signal REF. Specifically, when the chip select signal CS # is at high level and the access signal RD/WR for accessing data in the memory cell array is at low level, and when the high-level signal Cmp_ref is input from the arbiter 13, the command generation unit 14 generates a high-level refresh signal REF and outputs it to the memory cell array (not shown in the figure), the counter 12b and the inverter 12d of the control unit 12.

Furthermore, when a read or write command is input externally during each transaction (during a period that the chip select signal CS # is at low level), the command generation unit 14 generates a high level access signal RD/WR and output it to the memory cell array.

When a high-level refresh signal REF is input to the memory cell array, a memory refresh operation is performed, and when a high-level access signal RD/WR is input to the memory cell array, data read or write process is performed on the memory cell array.

Next, the refresh operation in the pSRAM according to this embodiment will be described with reference to FIG. 3. A case where the period tCSL in which the chip select signal CS # is at low level is longer than the generation interval tREFI of the refresh request signal Ref_request will be described as an example.

First, when the chip select signal CS # converts from high level to low level and a read or write command is input externally after the first transaction starts, the command generation unit 14 generates a high-level access signal RD/WR and outputs it to the memory cell array.

At time t1, when the high-level refresh request signal Ref_request is generated by the oscillator 11, the counter 12a of the control unit 12 increases the count value for counting the refresh request signal Ref_request from 0 to 1 and outputs a signal Cnt_req indicating that the count value is 1 to the comparator 12c. Furthermore, the comparator 12c compares the value of the signal Cnt_req and the value of the signal Cnt_exe (it is assumed to be 0 herein). Since the value of the signal Cnt_req is greater than the value of the signal Cnt_exe, a high-level output signal is output to the AND gate 12e. Furthermore, the AND gate 12e performs an AND operation on the output signal from the comparator 12c and the signal output from the inverter 12d (since the refresh signal REF is at low level in the beginning, the signal output from the inverter 12d is at high level), and outputs a high level signal Cmp_ref o the arbiter 13.

Since the chip select signal CS # is at low level at time t1, the arbiter 13 does not output the received high-level signal Cmp_ref to the command generation unit 14. Also, as described above, the command generation unit 14 generates the high-level access signal RD/WR and outputs it to the memory cell array.

Next, at time t2 after a predetermined interval tREFI from time t1, when a high level refresh request signal Ref_request is generated by the oscillator 11, the counter 12a of the control unit 12 increases the count value from 1 to 2 and outputs a signal Cnt_req indicating that the count value is 2 to the comparator 12c. Also, since the value of the signal Cnt_req is greater than the value of the signal Cnt_exe, the comparator 12c outputs a high-level output signal to the AND gate 12e. Furthermore, the same as the case at time t1, the AND gate 12e outputs a high-level signal Cmp_ref to the arbiter 13. The operations of the arbiter 13 and the command generation unit 14 at time t2 are the same as those at time t1.

When the chip select signal CS # converts from low level to high level after time t2, the arbiter 13 outputs the high level signal Cmp_ref to the command generation unit 14. On the other hand, when the access signal RD/WR becomes low level at time t3, the command generation unit 14 generates a high level refresh signal REF in response to the high level signal Cmp_ref input from the arbiter 13 at time t4, and outputs it to the memory cell array, the counter 12b and the inverter 12d of the control unit 12.

When the high-level refresh signal REF is input, the counter 12b of the control unit 12 increases the count value from 0 to 1 and outputs a signal Cnt_exe indicating that the count value is 1 to the comparator 12c. At time t4, since the value of signal Cnt_req is still greater than the value of signal Cnt_exe, the comparator 12c outputs a high-level output signal to the AND gate 12e. Note that the signal Cmp_ref output from the AND gate 12e becomes low level when the high level refresh signal REF is output from the command generation unit 14, and becomes high level again when the refresh operation ends and the refresh signal REF becomes low level. At this time, the arbiter 13 outputs a high level signal Cmp_ref to the command generation unit 14.

Then, at time t5 after a period tRFC (refresh interval) has elapsed from time t4, the command generation unit 14 generates the high-level refresh signal REF again in response to the high-level signal Cmp_ref input from the arbiter 13, and outputs it to the memory cell array, the counter 12b and the inverter 12d of the control unit 12. Here, when the high-level refresh signal REF is input, the counter 12b of the control unit 12 increases the count value from 1 to 2, and outputs the signal Cnt_exe indicating that the count value is 2 to the comparator 12c. Since the value of the signal Cnt_req and the value of the signal Cnt_exe are equal, the comparator 12c outputs a low-level output signal to the AND gate 12e. In this case, the signal Cmp_ref becomes low level. After that, when the refresh operation ends and the refresh signal REF becomes low level again, the signal Cmp_ref output from the AND gate 12e maintains low level. By now, the refresh operation is performed twice in response to the two refresh request signals Ref_request generated during the transaction, and then the transaction ends.

Figure 3:
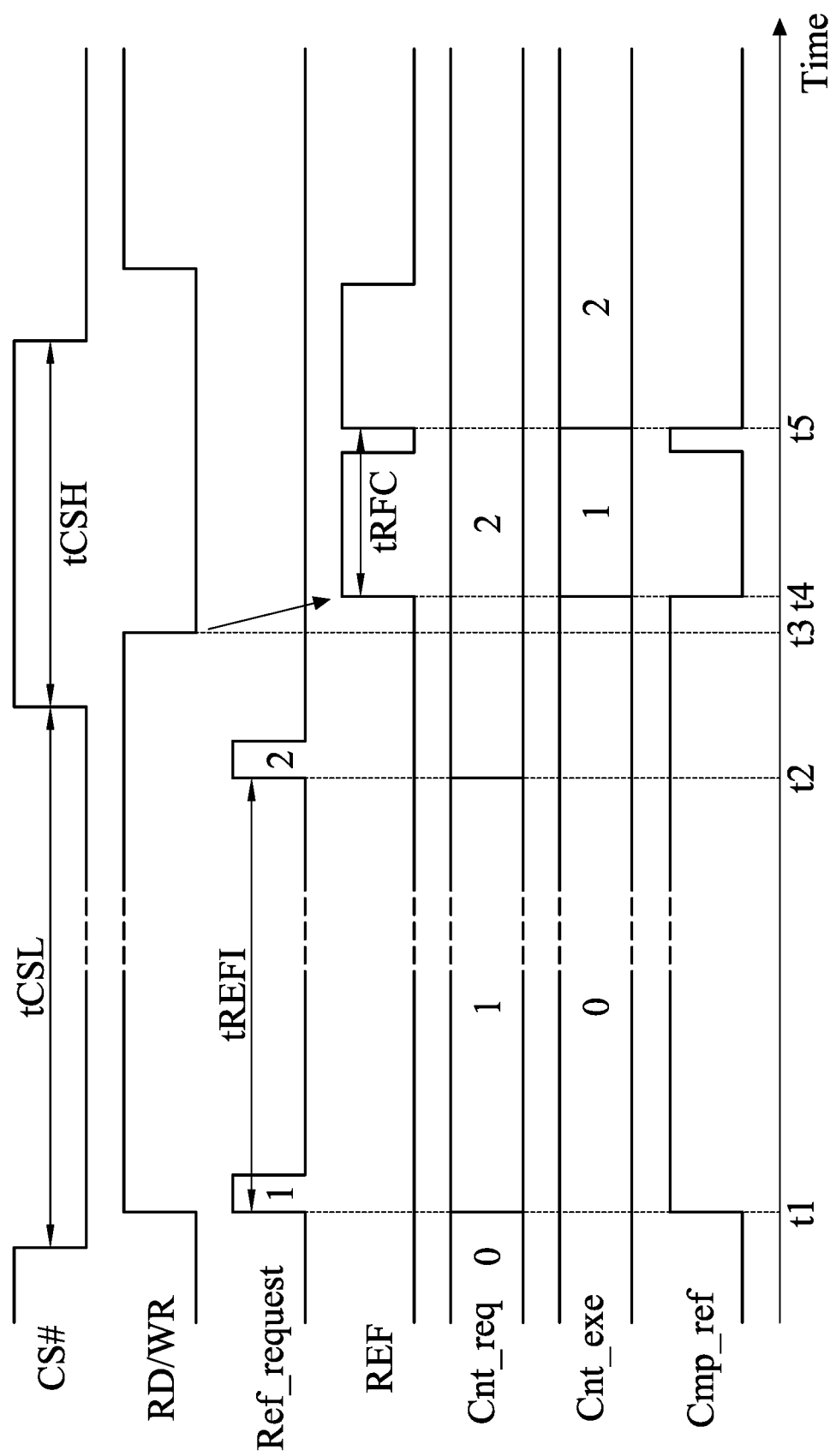
FIG. 3 is a waveform chart showing a signal in the pSRAM of the first embodiment.

In the example shown in FIG. 3, after the chip select signal CS # converted from low level to high level, it converts to low level again after the period tCSH has elapsed, so the second transaction starts. However, in this embodiment, since the second refresh operation is being performed when the second transaction starts, the command generation unit 14 waits until the second refresh operation is completed to set the access signal RD/WR to high level in response to the start of the second transaction.

As described above, according to the pSRAM of the present embodiment, even if the period tCSL in which the chip select signal CS # is at low level is longer than the generation interval tREFI of the refresh request signal Ref_request, a refresh operation can be reliably performed in response to each of the refresh requests generated during the transaction. Moreover, it is possible to suppress a decrease in the data transfer rate and maintain the data retention characteristics.

A second embodiment of the present invention will be described below. The pSRAM of this embodiment differs from that of the first embodiment in that it has a plurality of memory banks that are accessed in an interleaved manner. Configurations different from the first embodiment will be described below.

Figure 4:
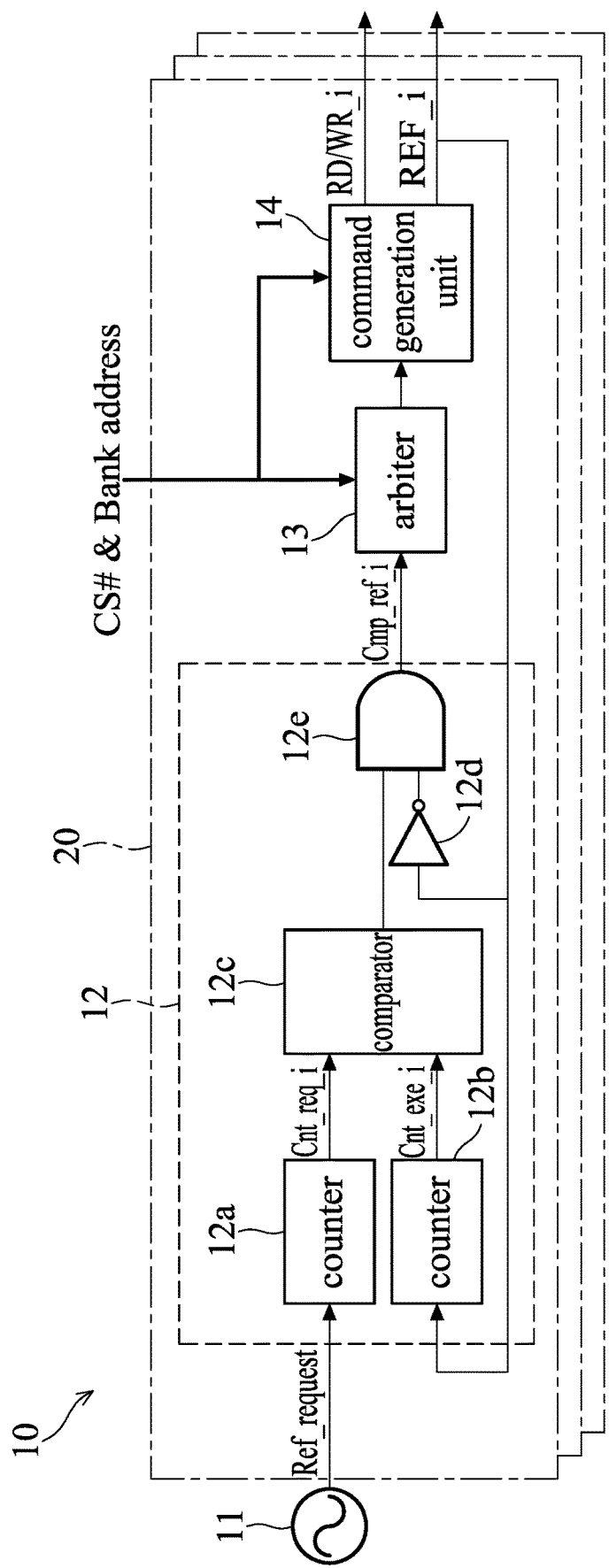
FIG. 4 is a block diagram showing a configuration example of the pSRAM in the second embodiment of the present invention.

In this embodiment, the pSRAM 10 includes a plurality of (for example, n (n is an integer equal to or greater than 2)) memory banks 20 that are accessed in an interleaved manner, as shown in FIG. 4. Each memory bank 20 includes a control unit 12, an arbiter 13, and a command generation unit 14.

In the present embodiment, when the selected memory bank 20 among the plurality of memory banks 20 is accessed during the first transaction, the controller 12 of each memory bank 20 controls refresh operations in memory banks 20 when a refresh request of the memory is generated during the first transaction. Specifically, after the first transaction ends, the control unit 12 of the memory bank 20 performs refresh operations for the number indicated in the refresh request signal Ref_request generated during the first transaction, and the control units 12 of the memory banks 20 other than the selected memory bank 20 controls the refresh operation in other memory banks 20 in response to the generated refresh request signal Ref_request during the first transaction.

For example, when the i-th ($0 \leq i \leq n-1$) memory bank 20 among the plurality of memory banks 20 is accessed in the first transaction, and when a memory refresh request is generated during the first transaction, refresh operations in the i-th memory bank 20 are performed as many as the number of refresh request signals Ref_request generated during the first transaction after the first transaction is completed. On the other hand, refresh operations in the memory banks 20 other than the i-th memory bank 20 are performed during the first transaction in response to the generated refresh request signal Ref_request.

It should be noticed that the present embodiment access the plurality of the memory bank in an interleaved pattern. Therefore, in one example, accessing to the other memory banks can be executed at the same time when executing refresh operation to the ith memory bank 20 after the first transaction finished, and thus increases the processing performance of the pSRAM. However, in another example, the present invention can, as shown in the first embodiment, only execute the refresh operation for the ith memory bank 20 after the first transaction ended and before the second transaction, and starts the second transaction after the refresh operation for the ith memory bank 20 finished.

In this embodiment, the arbiter 13 of each memory bank 20 receives a bank address signal Bank_address in addition to the chip select signal CS # and signal Cmp_ref. In this case, the arbiter 13 can operate in the same manner as in the first embodiment when the input bank address signal Bank_address indicates the memory bank in which the arbiter 13 is provided. The bank address signal Bank address can be generated by an address decoder circuit (not shown in the figure) provided in the pSRAM 10, for example.

In addition to the chip select signal CS # and the signal Cmp_ref, the bank address signal Bank_address is input to the command generation unit 14 of each memory bank 20 in this embodiment. In this case, the command generation unit 14 can operate in the same manner as in the first embodiment when the input bank address signal Bank_address indicates the memory bank in which it is provided.

Figure 5:
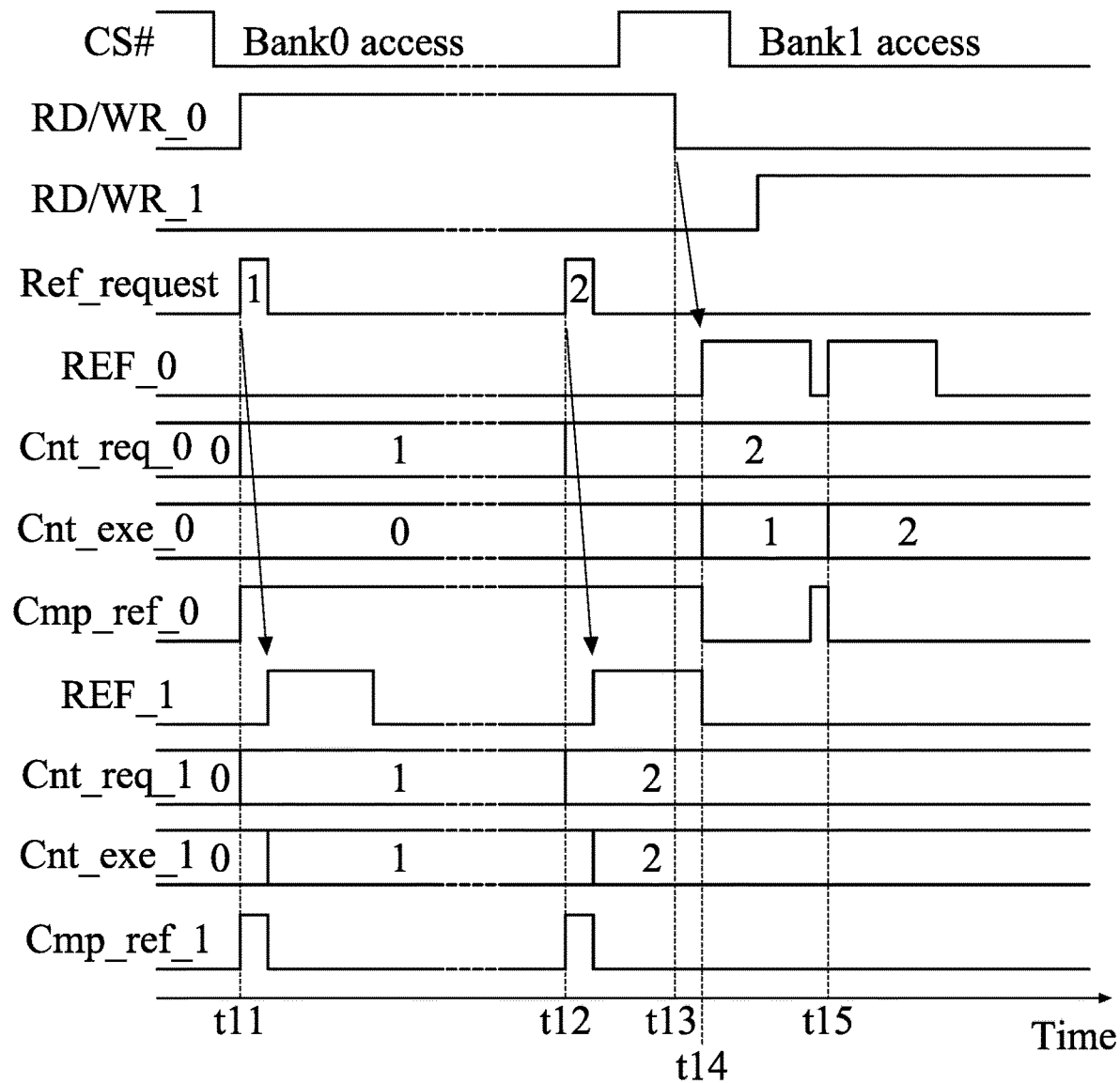
FIG. 5 is a waveform chart showing a signal in the pSRAM of the second embodiment.

The operation of the pSRAM according to the present embodiment will be described with reference to FIG. 5. A case where the 0th (i=0) memory bank 20 is accessed in the first transaction and the 1st (i=1) memory bank 20 is accessed in the second transaction will be described as an example herein.

Operations of the controller 12, arbiter 13, and command generation unit 14 of the 0th memory bank 20 at times t11, t12, t13, t14, and t15 during the 0th memory bank 20 is accessed in the first transaction are the same as the operations of the control unit 12, the arbiter 13, and the command generation unit 14 at times t1, t2, t3, t4, and t5. That is, the access signal RD/WR_0, refresh signal REF_0, signal Cnt_req_0, signal Cnt_exe_0, and signal Cmp_ref_0 of the 0th memory bank 20 shown in FIG. 5 are the same as each of the access signal RD/WR, refresh signal REF, signal Cnt_req, signal Cnt_exe, and signal Cmp_ref shown in FIG. 2.

As a result, when a memory refresh request is generated during the first transaction, the refresh operation in the 0th memory bank 20 is executed as many times as the number of refresh request signals Ref_request which is generated during the first transaction (twice in the example of the figure) during a period after the first transaction ended and before the second transaction.

Next, the refresh operation in the first (i=1) memory bank 20 during the first transaction will be described. First, when the chip select signal CS # converts from high level to low level, the first transaction starts. Since the first memory bank 20 is not the access target, the command generation unit 14 of the first memory bank 20 generates a low-level access signal RD/WR and output it to the memory cell array.

At time t11, when a high level refresh request signal Ref_request is generated by the oscillator 11, the counter 12a of the first memory bank 20 increases the count value from 0 to 1, and outputs the signal Cnt_req_1 indicating that the count value is 1 to the comparator 12c. Also, the comparator 12c of the first memory bank 20 compares the value of the signal Cnt_req_1 with the value of the signal Cnt_exe_1 (it is assumed to be 0 herein). Since the value of the signal Cnt_req_1 is greater than the value of the signal Cnt_exe_1, a high level output signal is output to the AND gate 12e of the first memory bank 20. Furthermore, the AND gate 12e of the first memory bank 20 performs an AND operation between the signal output from the comparator 12c and the signal output from the inverter 12d (which is at high level because the refresh signal REF_1 is at low level), and outputs a high level signal Cmp_ref_1 to the arbiter 13 of the first memory bank 20.

At time t11, since the first memory bank 20 is not the access target, so the arbiter 13 outputs signal Cmp_ref_1 to the command generation unit 14. Also, the command generation unit 14 of the first memory bank 20 generates a high-level refresh signal REF_1 in response to the high-level signal Cmp_ref_1 input from the arbiter 13, and outputs it to the memory cell array, the counter 12b and inverter 12d of the first memory bank 20. As a result, the first refresh operation is performed in the first memory bank 20 during the first transaction.

When the high-level refresh signal REF_1 is input, the counter 12b of the first memory bank 20 increases the count value from 0 to 1 and outputs the signal Cnt_exe_1 indicating that the count value is 1 to the comparator 12c. In this case, since the value of the signal Cnt_req_1 is equal to the value of the signal Cnt_exe_1, the comparator 12c of the first memory bank 20 outputs a low level output signal to the AND gate 12e. As a result, the signal Cmp_ref_1 output from the AND gate 12e of the first memory bank 20 becomes low level.

Next, at time t12, when the oscillator 11 generates a high-level refresh request signal Ref_request, the controller 12, arbiter 13, and command generation unit 14 of the first memory bank 20 operate in the same manner as at time t11. As a result, the second refresh operation of the first memory bank 20 is performed during the first transaction.

Note that all of the memory banks 20 other than the 0th memory bank 20 among the plurality of memory banks 20 can perform refresh operations in the same manner as the 1st memory bank 20.

In this way, when a memory refresh request is generated during the first transaction, refresh operations of the memory banks 20 other than the 0th memory banks 20 are performed in response to the generated refresh request signal Ref_request during the first transaction.

As described above, according to the pSRAM of the present embodiment, for the selected memory bank 20 (the 0th memory bank 20) to be accessed in the first transaction, during a period after the first transaction ended and before the second transaction, it is possible to perform refresh operations as many as the number of refresh requests which is generated in the first transaction. On the other hand, memory banks 20 not selected in the first transaction (first memory bank 20) can be refreshed immediately when a refresh request is generated during the first transaction. Thereby, the refresh operation in each of the memory banks 20 can be appropriately executed according to whether it is the selected memory bank 20 in the transaction. Furthermore, since the period tCSH after the end of the first transaction (for the 0th memory bank 20) and before the second transaction (for the 1st memory bank 20) can be shortened, the processing performance of the pSRAM can be improved.

Each of the embodiments described above is described to facilitate understanding of the present invention, and is not described to limit the present invention. Therefore, each element disclosed in each of the above embodiments is intended to include all modifications and equivalents within the technical scope of the present invention.

For example, in each of the above-described embodiments, as shown in FIG. 2 and FIG. 4, the control unit 12 includes a counter 12a, a counter 12b, a comparator 12c, an inverter 12d, and an AND circuit 12e. However, the configuration of the control unit 12 can be modified as appropriate, and various other configurations can be employed.

Furthermore, in the second embodiment described above, the case where the controller 12 is provided in each of the memory banks 20 has been described as an example, but the present invention is not limited to this case. For example, the pSRAM 10 can be provided with only one controller 12 controlling the refresh operation in each memory bank 20.

Furthermore, in the second embodiment described above, the case where the control unit 12, the arbiter 13, and the command generation unit 14 are provided in each of the memory banks 20 has been described as an example, but the present invention is not limited to this case. For example, one controller 12, one arbiter 13, and one command generation unit 14 may be provided, and the refresh operation in each memory bank 20 may be controlled using the controller 12, arbiter 13, and command generation unit 14.

What is claimed is:

1. A pseudo-static random access memory comprising:
   a control unit, wherein when a memory refresh request is generated during a first transaction, controlling refresh operations of the memory to be performed as many times as the number of refresh requests which is generated in the first transaction, wherein the refresh operations are performed during a period after the first transaction ends and before a second transaction which is after the first transaction.

2. The pseudo-static random access memory as claimed in claim 1, wherein:
   the control unit comprises:

a first counter, counting the number of refresh requests generated during the first transaction; and a second counter, counting the number of refresh operations during the period after the first transaction ended and before the second transaction;

the control unit performs refresh operations until the number of refresh operations counted by the second counter reaches the number of refresh requests counted by the first counter.

3. The pseudo-static random access memory as claimed in claim 2, wherein the control unit further comprises:

a comparator, comparing the number of refresh requests counted by the first counter and the number of refresh operations counted by the second counter.

4. The pseudo-static random access memory as claimed in claim 2, further comprising:

a command generation unit, generating a refresh signal for operating the refresh operation based on a refresh control signal from the control unit;

wherein the command generation unit outputs the refresh signal to the second counter each time it generates the refresh signal.

5. The pseudo-static random access memory as claimed in claim 4, wherein the command generation unit generates an access signal for accessing data in the memory cell array during the first transaction.

6. The pseudo-static random access memory as claimed in claim 4, further comprising:

an arbiter, outputting the refresh control signal to the command generation unit each time the refresh control signal is input from the control unit during a period after the first transaction ended and before the second transaction;

wherein the command generation unit generates the refresh signal each time the refresh control signal is input.

7. The pseudo-static random access memory as claimed in claim 1, further comprising:

a plurality of memory banks, which are accessed in an interleaved manner;

wherein the control unit performs the following operations:

when a selected memory bank among the plurality of memory banks is accessed in the first transaction and a memory refresh request is generated during the first transaction, controlling the refresh operations operated in the selected memory bank are performed as many times as the number of refresh requests which is generated during the first transaction during a period after the first transaction ended and before the second transaction; and controlling the refresh operations in memory banks other than the selected memory bank to be performed in response to the generated refresh request during the first transaction.

8. The pseudo-static random access memory as claimed in claim 7, wherein each of the plurality of memory banks comprises the control unit.

9. The pseudo-static random access memory as claimed in claim 8, wherein the pseudo-static random access memory is a clock-synchronous pseudo-static random access memory in which signals are input or output in synchronization with a clock signal.

10. The pseudo-static random access memory as claimed in claim 8, wherein the pseudo-static random access memory is an address-data multiplex interface type pseudo-static random access memory.

* * * * *